United States Patent [19]

Kamieniecki

[11] Patent Number: 4,544,887
[45] Date of Patent: Oct. 1, 1985

[54] METHOD OF MEASURING PHOTO-INDUCED VOLTAGE AT THE SURFACE OF SEMICONDUCTOR MATERIALS

[75] Inventor: Emil Kamieniecki, Lexington, Mass.

[73] Assignee: GTE Laboratories Incorporated, Waltham, Mass.

[21] Appl. No.: 435,847

[22] Filed: Oct. 21, 1982

[51] Int. Cl.[4] ............................................. G01R 31/26
[52] U.S. Cl. ............................ 324/158 R; 324/158 D
[58] Field of Search ........................ 324/158 R, 158 D

[56] References Cited

U.S. PATENT DOCUMENTS

| | | | |
|---|---|---|---|
| 4,286,215 | 8/1981 | Miller | 324/158 R |
| 4,333,051 | 6/1982 | Goodman | 324/158 R |
| 4,433,288 | 2/1984 | Moore | 324/158 R |

OTHER PUBLICATIONS

C. Munakata et al., "Non-Destructive Method of Observing Inhomogeneties in p-n Junctions . . . ", in *Japanese Jour. of App. Physics*, vol. 20, No. 2, Feb. 81, pp. 132–140.
T. Sukegawa et al., "Differential Photocurrent Method of Measurement . . . in a Semiconductor", in *IEEE Trans. on Electron Devices*, vol. ED27, No. 7, Jul. 80, pp. 1251–1255.
E. Johnson, "Large-Signal Surface Photovoltage Studies with Germanium", Physical Review, vol. III, No. 1, pp. 153–166, Jul. 1958.
A. Goodman, "A Method for the Measurements of Cadmium Sulfide", *Journal Phys. Chem. Solids*, vol. 23, pp. 1057–1066, 1962.
R. Williams, "Surface Photovoltage Measurements of Cadmium Sulfide", in *Journal Phys. Chem. Solids*, vol. 23, pp. 1057–1066, 1962.
S. Dahlberg, "Photovoltage Studies of Clean and Oxygen Covered Gallium Arsenide", *Surface Science*, vol. 59, pp. 83–96, 1976.
Kamieniecki, "Determination of Surface Space Charge Capacitance Using a Light Probe", in J. Vac. Sci. Tech., vol. 20, No. 3, Mar. 1982, pp. 811–814.
Physical Review, Gartner, W., "Depletion-Layer Photoeffects in Semiconductors", vol. 116, No. 1, Oct. 1959, pp. 84–87.

*Primary Examiner*—Stewart J. Levy
*Assistant Examiner*—Stephen M. Baker
*Attorney, Agent, or Firm*—David M. Keay

[57] ABSTRACT

A method of determining the photo-induced voltage at the surface of a specimen of semiconductor material. A beam of monochromatic light of low intensity and of wavelength shorter than that corresponding to the energy gap of the semiconductor material is directed at the specimen. The light beam is modulated, and the resulting AC photovoltage signal induced at the surface of the specimen is measured. Measurements of surface photovoltage made in this way can be used to determine the surface space-charge capacitance of the specimen of semiconductor material and, therefore, to characterize the properties of the semiconductor material using conventional capacitance analysis.

4 Claims, 3 Drawing Figures

4,544,887

METHOD OF MEASURING PHOTO-INDUCED VOLTAGE AT THE SURFACE OF SEMICONDUCTOR MATERIALS

BACKGROUND OF THE INVENTION

This invention relates to methods of measuring photo-induced voltage at the surface of semiconductor materials. More particularly, it is concerned with methods of obtaining measurements of the change in surface potential barriers in semiconductor materials using modulated monochromatic light.

It is desirable to be able to obtain measurements of the surface space-charge capacitance of bodies of semiconductor material. Information on the surface space-charge capacitance enables characterization to be made of the bulk properties and the surface properties of a semiconductor body. Although various techniques have been developed for determining the surface space-charge capacitance of semiconductor materials, they are either destructive of the body, lead to changes in the semiconductor properties in the region of the body adjacent to the surface, or are not sufficiently accurate.

SUMMARY OF THE INVENTION

It has been found that there is a correlation between the surface space-charge capacitance of a specimen of semiconductor material and the photo-induced voltage at the surface as determined by the method of the present invention. Thus it is possible to determine surface space-charge capacitance in a non-destructive manner using light and to characterize semiconductor materials using conventional capacitance analysis. The method of determining the photo-induced voltage of a region of the surface of a specimen of semiconductor material in accordance with the present invention comprises directing a beam of monochromatic light at the region of the surface of the specimen of semiconductor material. The wavelength of the monochromatic light is shorter than that corresponding to the energy gap of the semiconductor material. The intensity of the beam of monochromatic light is modulated. The variation in the surface potential barrier of the region of the specimen induced by the variations in the intensity of the light impinging on the region is detected. The intensity of the beam of monochromatic light and the frequency of modulation are selected such that the variation in the surface potential barrier is directly proportional to the intensity of light and reciprocally proportional to the frequency of modulation.

For a better understanding of the present invention, together with other and further objects, advantages, and capabilities thereof, reference is made to the following discussion and appended claims in connection with the above-described drawings.

DETAILED DESCRIPTION OF THE INVENTION

It has been determined that surface photovoltage $\delta V_s$ induced in a specimen of semiconductor material by low intensity modulated light is proportional to the reciprocal of the semiconductor space-charge capacitance $C_{sc}$. When the surface of the specimen is illuminated uniformly this relationship is expressed as $$\delta V_s = \frac{\Phi(1-R)}{Kf} qC_{sc}^{-1}$$

where $\Phi$ is the incident photon flux, R is the reflection coefficient of the semiconductor material, f is the modulation frequency of the light, and q is the electron charge. K is equal to 4 for squarewave modulation of light intensity and is equal to $2\pi$ for sinusoidal modulation. Details on the derivation of the relationship are presented in a paper by Emil Kamieniecki entitled "Determination of Surface Space Charge Capacitance Using a Light Probe" published in the Journal of Vacuum Science Technology, Vol. 20, No. 3, Mar. 1982, pages 811–814.

The photo-induced surface voltage is measured in accordance with the method of the present invention by inducing a potential barrier height change at the surface of a specimen of semiconductor material by exposing a region of the surface of the specimen to monochromatic light of shorter wavelength than that corresponding to the energy gap of the semiconductor material. That is, $h\nu > Eg$ where $h\nu$ is the photon energy of the light and Eg is the energy gap of the semiconductor material. The intensity of the light impinging on the specimen is relatively low. The light is modulated at a modulation frequency. The light beam may be chopped by periodically interrupting the beam of light to produce squarewave modulation. If the light source is a device such as a light emitting diode, a sinusoidal signal may be applied thereto to produce sinusoidal modulation. The intensity of the light and the modulation frequency are selected such that the photo-induced variation in the potential barrier height is directly proportional to the intensity of the incident light and reciprocally proportional to the modulation frequency.

Figure 1:
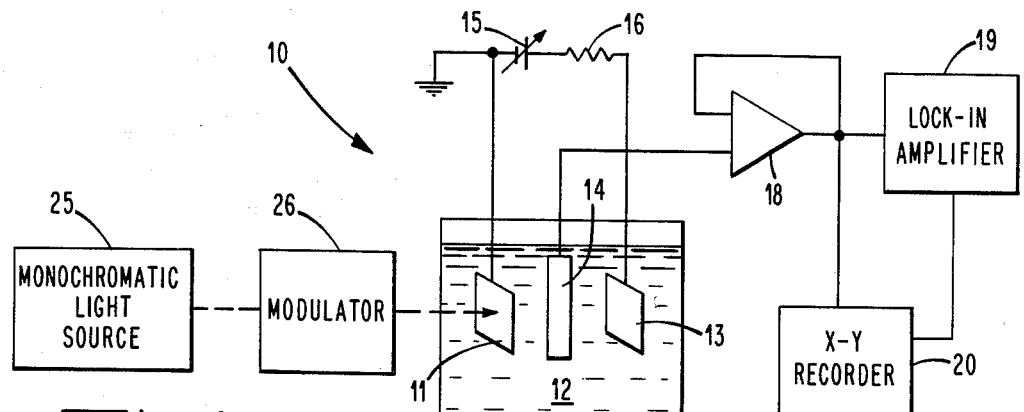
FIG. 1 is a schematic representation of one form of apparatus which may be employed to measure the photo-induced surface voltage of a specimen of semiconductor material in accordance with the present invention.

FIG. 1 is a representation of apparatus 10 for measuring the photo-induced voltage at the surface of a specimen of semiconductor material 11. The specimen 11 is placed in a suitable electrolyte 12 together with a counter electrode 13 and a reference electrode 14. As illustrated in FIG. 1 the specimen 11 is connected to ground and through an adjustable DC voltage source 15 and resistance 16 to the counter electrode 13. The reference electrode 14 is connected to the input of a high input impedance buffer amplifier 18. The output of the buffer amplifier 18 is connected to a lock-in amplifier 19, and the outputs of the buffer amplifier 18 and the lock-in amplifier 19 are connected to an X-Y recorder 20. Other forms of data acquisition apparatus may be used in place of the X-Y recorder. A monochromatic light source 25, specifically a laser which may include an arrangement for reducing the intensity of the light output to a desired level, directs a beam of light onto the specimen 11. The light beam passes through a modulator 26 which may be a mechanical chopper or an acousto-optical modulator for periodically interrupting the beam of light.

The modulated beam of light strikes the surface of the specimen 11, and the surface barrier potential in the specimen 11 varies by a light-induced amount. The entire surface of the specimen may be illuminated uniformly by the light or, alternatively, the light may be directed at a spot on the surface. Since the specimen 11 is grounded, the variation in the surface barrier potential is detected as a variation in the potential of the reference electrode 14. The buffer amplifier 18 responds to the potential variations as the incident light varies to produce an AC signal indicative thereof. The lock-in amplifier 19 and X-Y recorder 20 operate to further process and record the measurement data.

Figure 2:
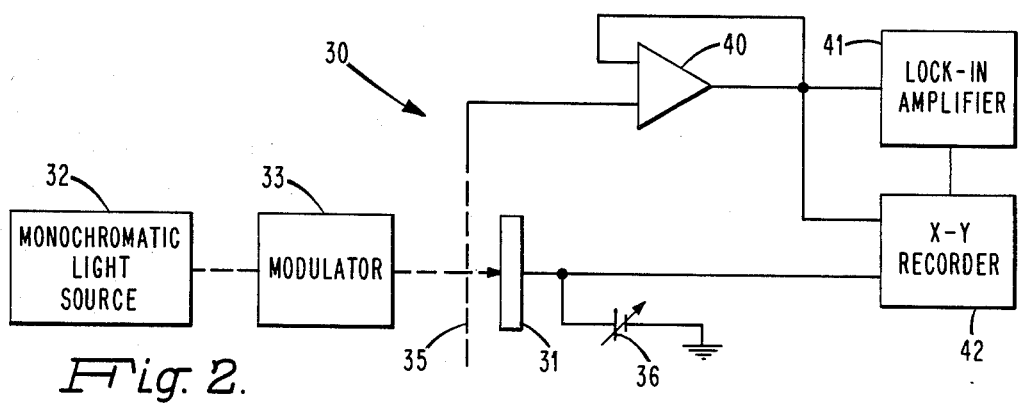
FIG. 2 is a schematic representation of another form of apparatus which may be employed to measure the photo-induced surface voltage of a specimen of semiconductor material in accordance with the present invention.

FIG. 2 is a representation of another apparatus 30 for measuring the photo-induced voltage at the surface of a specimen 31 of semiconductor material. The apparatus includes a source of monochromatic light 32, typically a laser and an arrangement for controlling the intensity of the light output. The beam of light is directed through a modulator 33 to impinge on a region of the specimen 31. The modulated light impinges on and passes through a partially transmissive conductive reference electrode 35 which is spaced from the specimen 31 by an insulating medium such as a gas or a vacuum. The specimen 31 is connected through an adjustable DC biasing source 36 to ground. The reference electrode 35 is connected to the input of a high input impedance buffer amplifier 40. The output of the buffer amplifier 40 is connected to a lock-in amplifier 41. The outputs of the buffer amplifier 40 and the lock-in amplifier 41 and the specimen 31 are connected to an X-Y recorder 42. As an alternative, other forms of data acquisition systems may be employed.

The variations in the surface barrier potential in the specimen induced by the variations in the incident light causes the potential of the reference electrode 35 to vary. This AC signal is applied to the buffer amplifier 40. The lock-in amplifier 41 and X-Y recorder 42 further process and record the measurement data.

In apparatus employed in measuring the surface induced photovoltage in accordance with the method of the invention the wavelength of the monochromatic light is selected so that the product of the absorption coefficient of the semiconductor material and the width of the depletion layer of the specimen is much greater than one. That is, $\alpha w \gg 1$ where $\alpha$ is the absorption coefficient and $w$ is the width of the depletion layer. The maximum intensity of the beam of light $\Phi$ and the frequency of modulation f are selected such that the AC photo-induced voltage signal $\delta V_s$ is directly proportional to the maximum intensity of the light and reciprocally proportional to the frequency of modulation; that is, $\delta V_s \propto \Phi/f$. Another way of expressing the relationship is that the second derivative of the AC voltage signal $\delta V_s$ with respect to the maximum intensity of light $\Phi$ divided by the frequency of modulation f is approximately zero; that is, $$\frac{d^2(\delta V_s)}{d(\Phi/f)^2} \approx 0.$$

Figure 3:
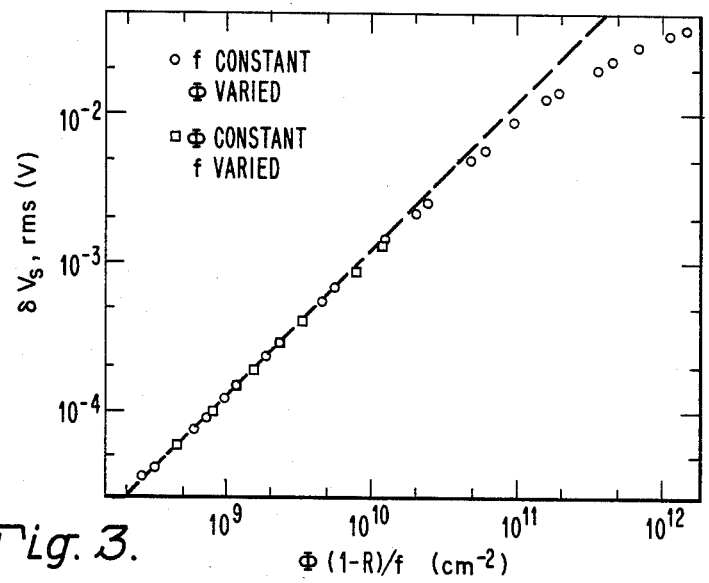
FIG. 3 is a graph illustrating relationships between the induced photovoltage at the surface of a specimen of semiconductor material and the combination of the incident light and the modulating frequency of the light.

FIG. 3 is a graph illustrating measurements indicating the linear relationship between $\delta V_s$ and $\Phi/f$ made on a specimen of n-type gallium arsenide utilizing apparatus similar to that illustrated in FIG. 1. The specimen was placed in an electrolyte 12 of $$CH_3CN + 0.1M[n\text{-}Bu_4N]BF_4$$

with a counter electrode of platinum and an $Ag/Ag^+$ reference electrode. The monochromatic light source utilized a 5 mW helium-neon laser which produced monochromatic light of 632.8 nm wavelength (photon energy $h\nu = 1.96$ eV). The light beam uniformly illuminated the surface of the specimen. The intensity of the incident light was reduced with neutral density filters to be about 100 nW cm$^{-2}$. The equilibrium value of the surface potential barrier of the specimen $V_{so}$ was $-0.6$ V. The apparatus employed a high input impedance buffer amplifier, a PAR model 124 A lock-in amplifier, and a Hewlett-Packard model 7047 A X-Y recorder.

Two sets of data are displayed in FIG. 3. Measurements were made of the surface photovoltage $\delta V_s$ with the modulation frequency f at 100 Hz and the light intensity, or photon flux, $\Phi$ varied. Measurements of surface photovoltages $\delta V_s$ were also made with the expression $\Phi(1-R)$ constant, $\Phi$ equal $3.4 \times 10^{11}$ cm$^{-2}$s$^{-1}$, and the modulation frequency f varied.

Measurements of the surface photovoltage signal induced by modulated, low intensity, short wavelength illumination in accordance with the present invention can be used to determine surface space-charge capacitance and, therefore, to characterize semiconductor materials using conventional capacitance analysis.

While there has been shown and described what is considered a preferred embodiment of the present invention, it will be obvious to those skilled in the art that various changes and modifications may be made therein without departing from the invention as defined by the appended claims.

What is claimed is:

1. The method of determining the photo-induced voltage at a region of the surface of a specimen of semiconductor material comprising
    directing a beam of monochromatic light at a region of the surface of a specimen of semiconductor material, the wavelength of the monochromatic light being shorter than that corresponding to the energy gap of the semiconductor material;
    modulating the intensity of the beam of monochromatic light at a frequency (f) so that the intensity ($\Phi$) of the light impinging on said region of the surface of the specimen varies from a maximum to a minimum; and
    measuring the resulting AC voltage signal ($\delta V_s$) induced at the region of the surface of the specimen by the modulated light;
    the intensity of the beam of light ($\Phi$) and the frequency of modulation (f) being selected such that the AC voltage signal ($\delta V_s$) is directly proportional to the intensity of light ($\Phi$) and reciprocally proportional to the frequency of modulation (f); ($\delta V_s \propto \Phi/f$).

2. The method in accordance with claim 1 wherein the wavelength of the monochromatic light is selected so that the product of the absorption coefficient of the specimen of semiconductor material ($\alpha$) and the width of the depletion layer of the specimen of semiconductor material (w) is greater than one; ($\alpha w > 1$).

3. The method in accordance with claim 2 wherein the intensity of the beam of monochromatic light is squarewave modulated.

4. The method in accordance with claim 2 wherein the intensity of the beam of monochromatic light is sinusoidally modulated.

* * * * *